United States Patent [19]
Kato

[11] Patent Number: 6,009,304
[45] Date of Patent: Dec. 28, 1999

[54] TWO-OUTPUT LOW-NOISE DOWN CONVERTER CIRCUIT

[75] Inventor: Masahiro Kato, Nagaokakyo, Japan

[73] Assignee: Sharp Kabushiki Kaisha, Osaka, Japan

[21] Appl. No.: 08/963,821

[22] Filed: Nov. 4, 1997

[30] Foreign Application Priority Data

Dec. 27, 1996 [JP] Japan .................................. 8-350451

[51] Int. Cl.$^6$ .................................................. H04B 1/00
[52] U.S. Cl. ............................................ 455/3.2; 455/225
[58] Field of Search ........................... 455/3.2, 255, 303; 330/124 R

[56] References Cited

U.S. PATENT DOCUMENTS

| | | | |
|---|---|---|---|
| 5,027,430 | 6/1991 | Yamauchi et al. | 455/188.1 |
| 5,345,591 | 9/1994 | Tsurumaki et al. | 455/3.2 |
| 5,568,158 | 10/1996 | Gould | 343/756 |
| 5,584,064 | 12/1996 | Nakamura | 455/3.2 |
| 5,649,311 | 7/1997 | Somei | 455/188.1 |
| 5,752,180 | 5/1998 | Guo et al. | 455/3.2 |

FOREIGN PATENT DOCUMENTS

| | | |
|---|---|---|
| 0 300173 A2 | 1/1989 | European Pat. Off. . |
| 07 030301 | 1/1995 | Japan . |
| 7-007330 | 1/1995 | Japan .............................. H03D 7/00 |
| 7-030301 | 1/1995 | Japan .............................. H01P 1/16 |

*Primary Examiner*—Reinhard J. Eisenzopf
*Assistant Examiner*—Makoto Aoki

[57] ABSTRACT

The invention provides a two-output low-noise down converter circuit which is improved in the isolation between two outputs. In the two-output low-noise down converter circuit, an input signal is divided into two divisional signals of different polarization systems and then the divisional two signals are processed by two-system signal processing circuits which comprise low-noise amplifiers, band-pass filters, frequency converter circuits and a local oscillator, respectively. The two-output low-noise down converter circuit includes: a switching circuit for performing switching control on the outputs of the two signal processing circuits responsive to the voltages applied to two output terminals, and for selectively outputting two polarized signals to its output terminals; intermediate frequency amplifiers for amplifying the two outputs of the switching circuit and leading out the resulting outputs at the two output terminals; and a control circuit for controlling the turning-on and -off of the power of the intermediate frequency amplifiers responsive to loads of the two output terminals.

5 Claims, 4 Drawing Sheets

TWO-OUTPUT LOW-NOISE DOWN CONVERTER CIRCUIT

BACKGROUND OF THE INVENTION

The present invention relates to a two-output low-noise down converter circuit for reception of satellite broadcasting and, in particular, to a two-output low-noise down converter circuit which improves in the isolation characteristic of two outputs divided by switching.

FIG. 4 is a block diagram of a conventional two-output low-noise down converter circuit which is capable of outputting signals to two BS receivers by one circuit. Two signals received by an antenna 1, such as a left-handed polarization signal (hereinafter, referred to as "L signal") and a right-handed polarization signal (hereinafter, referred to as "R signal") or a horizontal polarization signal (hereinafter, referred to as "H signal") and a vertical polarization signal (hereinafter, referred to as "V signal"), are separated into two systems, and respectively fed to independent two transfer systems comprising low-noise amplifiers 2a, 2b, band-pass filters (hereinafter, referred to as "BPFs") 3a, 3b and mixer circuits 5a, 5b which convert input signal into an intermediate frequency signal using a local oscillating frequency derived from a local oscillator (LO) 4, respectively.

Then, the two signals, after converted into signals of intermediate frequency by the two independent transfer systems, respectively, are led to a switching circuit 6, where either the L signal or the R signal is selected. Although the case is the same also with the H signal and the V signal, the following description will be made with the L signal and the R signal. The two signals selected by the switching circuit 6 are amplified to intermediate frequencies by intermediate frequency amplifiers 7a, 7b, respectively, from which outputs in the following combinations are derived at independent output terminals 8a, 8b:

|  | Output signal |
| --- | --- |
| Output terminal 8a | L R L R |
| Output terminal 8b | R L L R |

The signal selection of two input signals by the switching circuit 6 is judged by a comparator 9 on the basis that a voltage applied to the output terminals 8a, 8b is taken, for example, as High for 16 to 21 V DC, and Low for 10.5 to 14.5 V DC, and then the selection is effected by an output of the comparator 9. As a result, the relationship between the voltage applied to the output terminals 8a, 8b and the output signal is as follows:

|  | Applied voltage |  | Output signal |
| --- | --- | --- | --- |
| Output terininals 8a, 8b | High | → | L signal |
| Output terininals 8a, 8b | Low | → | R signal |

The numeral 10 in the figure denotes a power supply circuit for supplying voltage to the individual sections of the circuit.

According to the above prior art, with the aforementioned circuit construction, two signals of L and R signals, which are independent of each other, are outputted at the two output terminals. However, there are following problems caused by the circuit construction in terms of the isolation characteristic, which is one of the performances of low-noise down converters and shows, when the L signal, one of the two signals, is selected and outputted at an output terminal, the extent how the R signal, the other signal, leaks to the output terminal.

As shown in FIG. 5, the L signal or R signal which is selected and outputted after the switching circuit 6 onwards is terminated by a resistance of 75 Ω at the output terminal. The isolation characteristic of the switching circuit 6 is determined by this impedance matching, and the resulting isolation characteristic makes the isolation characteristic of the intermediate frequency circuit section of the low-noise down converter circuit, as it is.

For the two-output low-noise down converter circuit, it is not necessary to use two output terminals at the same time. When only one output terminal is used, there would occur deterioration in the isolation characteristic other than the isolation of the switching circuit unless the other output terminal is terminated by a resistance of 75 Ω.

In more detail, in the conventional circuit construction, as shown in FIG. 6, with one output terminal 8b open, the signal selection by the switching circuit 6 would be such that if the DC voltage is normally Low, the R signal is normally selected at the output terminal 8b. For example, in the case where the L signal has been selected and outputted at the output terminal 8a, if the R signal is normally selected and outputted at the output terminal 8b as described above with the output terminal 8b open, then the R signal would be reflected by the output terminal 8b because of a mismatching of impedance due to the open state of the output terminal 8b, leaking to the other output terminal 8a, so that the isolation characteristic of the two-output low-noise down converter circuit would be deteriorated.

As measures for such problems, it has been practiced, for example, to attach a metal shielding plate so that the output signal reflected by one output terminal will not be connected with the other output terminal, or to attach a metal plate for grounding reinforcement, or to provide a resistor in series on the output signal line for damping of the signal, with a view to improving the isolation between the two output terminals. However, in many cases, it would be difficult to make changes in the wiring pattern required for such measures. Yet, attaching the shielding plate or the like would cause cost increases, as a further problem.

SUMMARY OF THE INVENTION

An object of the present invention is therefore to provide a two-output low-noise down converter circuit which is capable of improving the isolation between the two output terminals with a simple and inexpensive constitution.

In order to achieve the aforementioned object, there is provided a two-output low-noise down converter circuit in which a satellite broadcasting reception signal received by an antenna is divided into two signals of different polarization systems and which comprises: a first frequency converter circuit made up of a first low-noise amplifier, a first band-pass filter and a first mixer that converts one divisional input signal into an intermediate frequency signal by a local oscillating frequency derived from a local oscillator; a second frequency converter circuit made up of a second low-noise amplifier, a second band-pass filter and a second mixer that converts the other divisional input signal into an intermediate frequency signal by a local oscillating frequency derived from the local oscillator; a switching circuit having a first terminal and a second terminal for selectively outputting two output signals of the first and second frequency converter circuits; and first and second intermediate frequency amplifiers for amplifying the two output signals of the switching circuit and selectively outputting two signals of different polarization systems at the first output terminal and the second output terminal, respectively; a first control circuit for, when the first or second output terminal is of no load, shutting off power of the first or second intermediate frequency amplifier connected to the no-load output terminal.

In the two-output low-noise down converter circuit according to the first embodiment of the present invention, the satellite broadcasting reception signal received by the antenna is divided into two signals of different polarization systems and then respectively converted into intermediate frequency signals by the first and second frequency converter circuits which respectively comprise the first and second low-noise amplifiers, the first and second band-pass filters, the local oscillator and the first and second mixers, thus being fed to the switching circuit. The switching circuit performs switching control on the input two intermediate frequency signals of different polarization systems, selectively outputting the two signals at the first terminal and the second terminal, respectively.

The signals selectively outputted from the first and second terminals of the switching circuit are amplified by the first and second intermediate frequency amplifiers, and outputted to the first and second output terminals. When it is detected by the first control circuit that no load is connected to the first or second output terminal, the first control circuit shuts off the power of the first or second intermediate frequency amplifier connected to the first or second output terminal to which no load is connected. As a result, the output to the output terminal to which no load is connected is eliminated, by which any reflection of the signal due to an impedance mismatching at the no-load output terminal is eliminated. Thus, the isolation between the two outputs can be improved, so that occurrences of any leaks of the signal to the other output terminal can be prevented.

Also, there is provided the two-output low-noise down converter circuit, wherein the switching circuit as well as the first intermediate frequency amplifier and the second intermediate frequency amplifier connected to the first terminal and the second terminal of the switching circuit, respectively, are formed in an identical integrated circuit.

In the two-output low-noise down converter circuit according to the second embodiment of the present invention, since the switching circuit, the first and second intermediate frequency amplifiers and the wirings thereamong are formed in an identical integrated circuit, wirings that might affect the isolation in the relationship between circuit and wiring become constant and can be fixed to the best conditions. Thus, the isolation between the two output signals can be set to the best condition, while the pattern layout of the whole two-output low-noise down converter circuit can be achieved easily.

Also, there is provided the two-output low-noise down converter circuit, further comprising a second control circuit for controlling switching of the switching circuit based on voltages applied to the first and second output terminals.

In the two-output low-noise down converter circuit according to the third embodiment of the present invention, different DC voltages responsive to the polarization systems of the signals to be outputted are applied to the first and second output terminals, respectively. Then, the second control circuit detects the voltages of the first and second output terminals, and controls the switching of the switching circuit based on the detected voltages. Thus, the switching circuit can be controlled in such a manner that a signal of a polarization system responsive to the voltage applied to an output terminal will be outputted to the intermediate frequency amplifier connected to this output terminal.

Also, there is provided the two-output low-noise down converter circuit, wherein the switching circuit, the first and second intermediate frequency amplifiers, the first control circuit for controlling power of the first and second intermediate frequency amplifiers and the second control circuit for controlling the switching of the switching circuit are formed in an identical integrated circuit.

In the two-output low-noise down converter circuit according to the forth embodiment of the present invention, since the switching circuit, the first and second intermediate frequency amplifiers, the first control circuit, the second control circuit and the wirings thereamong are formed in an identical integrated circuit, the relationship between circuit and wiring can be fixed to the best conditions, and wirings that might affect the isolation becomes constant. Thus, the isolation between the two output signals can be set to the best condition, while the pattern layout of the whole two-output low-noise down converter circuit can be achieved easily.

Also, there is provided the two-output low-noise down converter circuit, wherein terminals for receiving voltages of the first and second output terminals are provided to the integrated circuit and the voltages of the first and second output terminals fed from the terminals to the integrated circuit are fed to the first and second control circuits, respectively.

In the two-output low-noise down converter circuit according to the fifth embodiment of the present invention, terminals for feeding the voltages of the first and second output terminals are provided to the integrated circuit in which the switching circuit, the first and second intermediate frequency amplifiers and the first and second control circuits are integrally formed, and the terminals are connected to the input terminals of the first and second control circuits. Thus, the two control circuits are controlled by the voltages of the first and second output terminals, so that the construction of the control circuits can be simplified.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
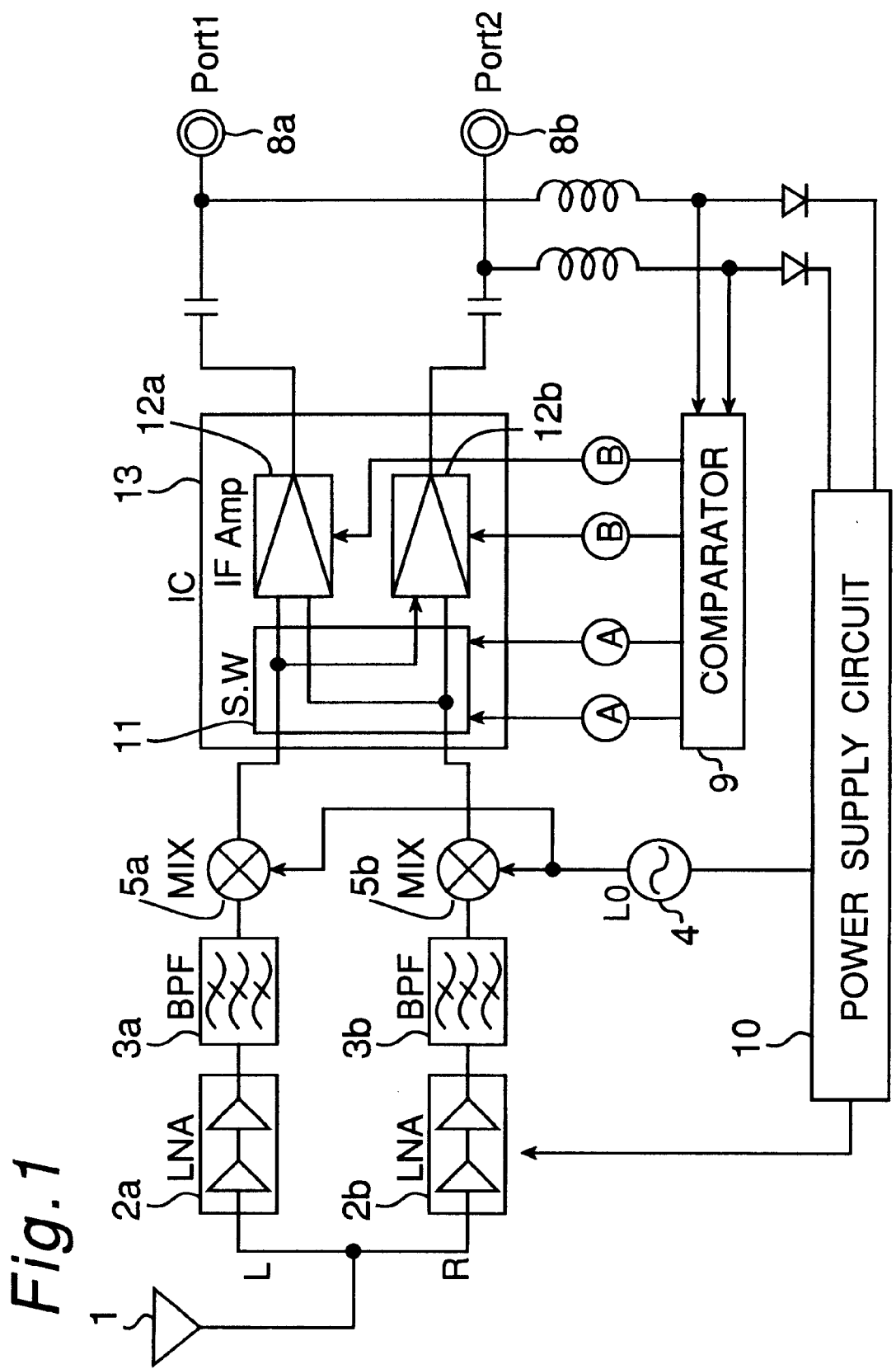
FIG. 1 is a block diagram of one embodiment of the present invention.
Figure 4:
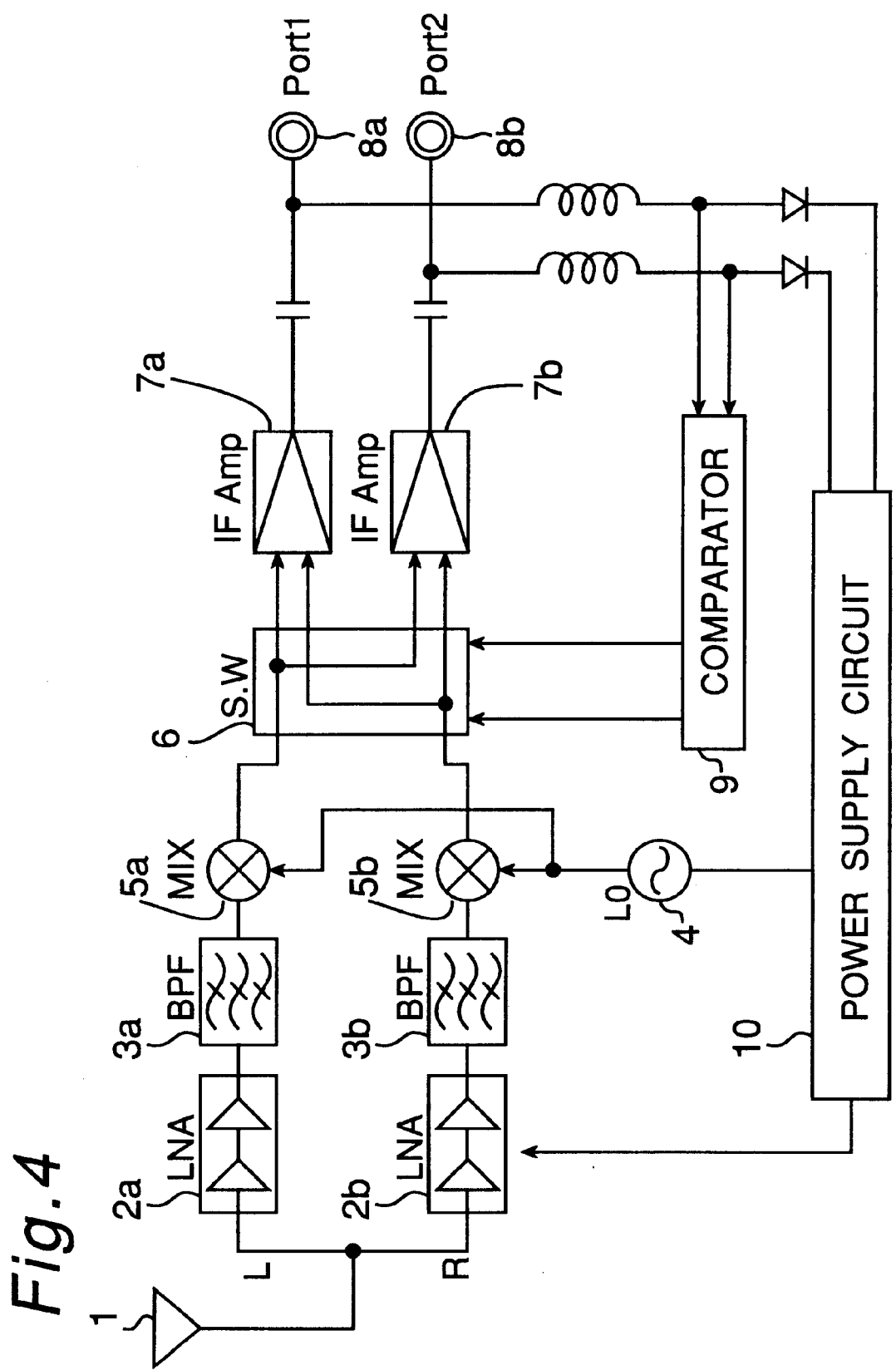
FIG. 4 is an arrangement diagram of a prior art example.
Figure 5:
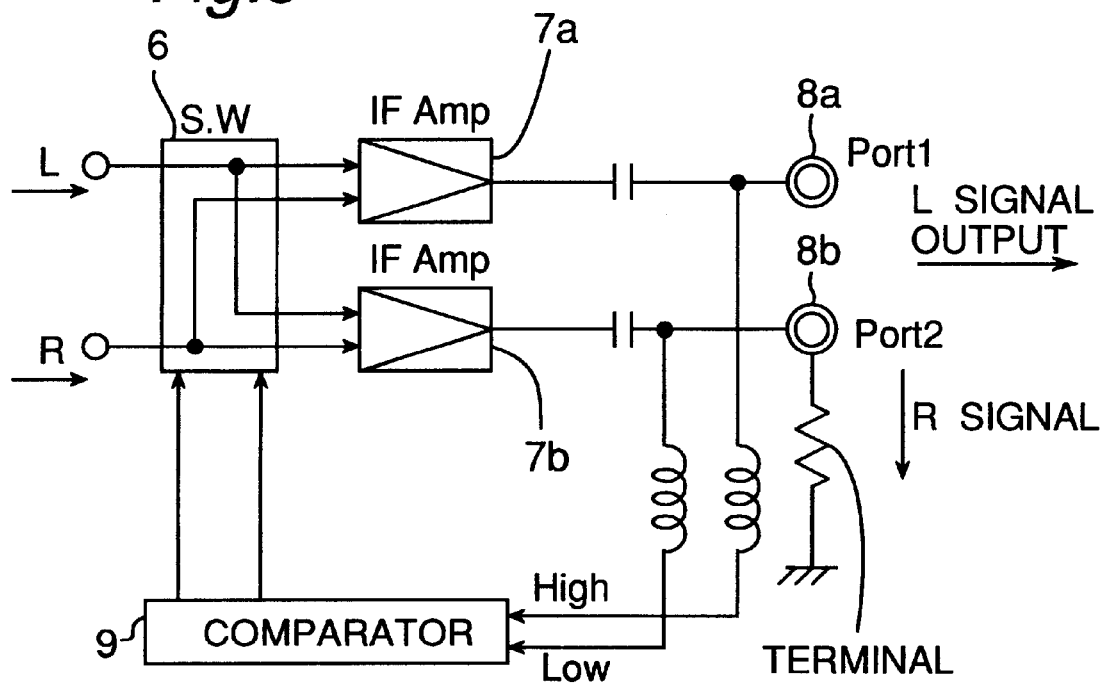
FIG. 5 is an operational explanatory view of main part of FIG. 4.
Figure 6:
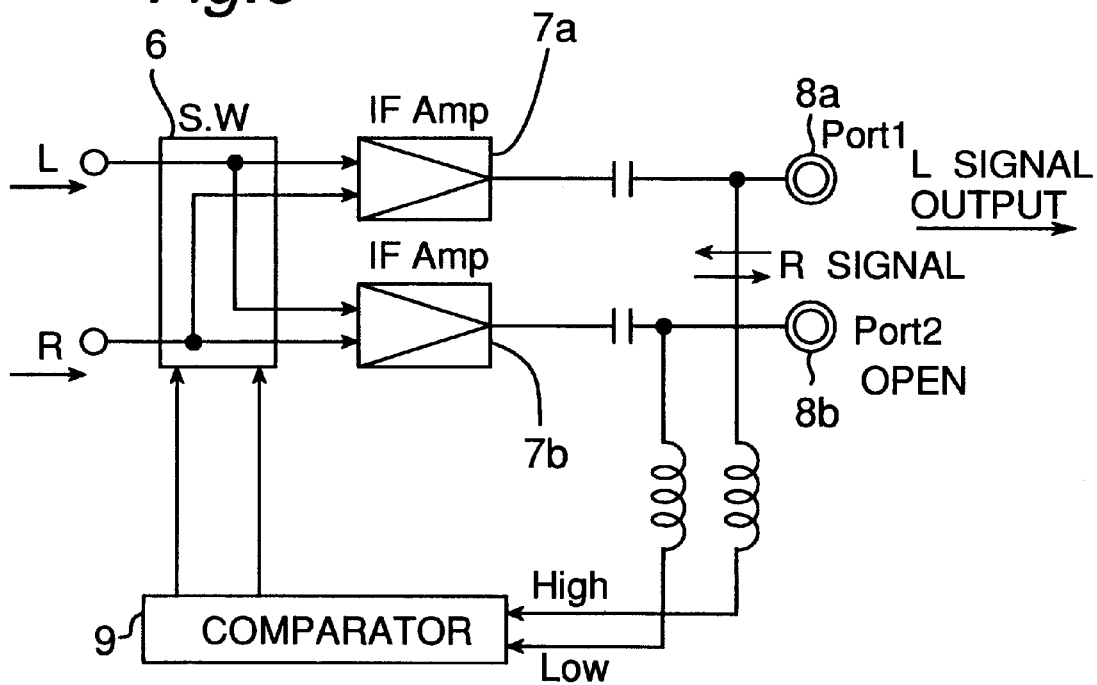
FIG. 6 is an operational explanatory view of main part of FIG. 4.

Hereinbelow, embodiments of the present invention are described. FIG. 1 is a block diagram of a first embodiment of the present invention, where component parts corresponding to those of the prior art example shown in FIG. 5 are designated by the same numerals and characters and their description is omitted. Referring to FIG. 1, reference numeral 11 denotes a switching circuit corresponding to the switching circuit 6 shown in FIG. 4, 12a and 12b denote intermediate frequency amplifiers, where the switching circuit 11 and the intermediate frequency amplifiers 12a, 12b are formed within an integrated circuit 13. In the integrated circuit 13, are provided control terminals A for the switching circuit 11 and control terminals B for controlling the power-on and -off of the intermediate frequency amplifier 12a or 12b.

To output terminals 8a, 8b of this two-output low-noise down converter circuit, depending on the signals to be selected, whether the L signal or the R signal, their corresponding DC voltages of, for example, 16 to 21 V DC or 10.5 to 14.5 V DC or the like are fed. Therefore, a comparator 9 detects the voltage applied to the output terminal 8a or 8b as a signal of Low or High and, responsive to this signal, feeds a control signal to the switching circuit 11. Accordingly, the switching circuit 11 selects the L signal or the R signal through a switching in the same manner as in the prior art, and feeds it to the succeeding-stage intermediate frequency amplifier 12a or 12b, thus outputting the L signal or the R signal at the output terminal 8a or 8b.

Figure 2:
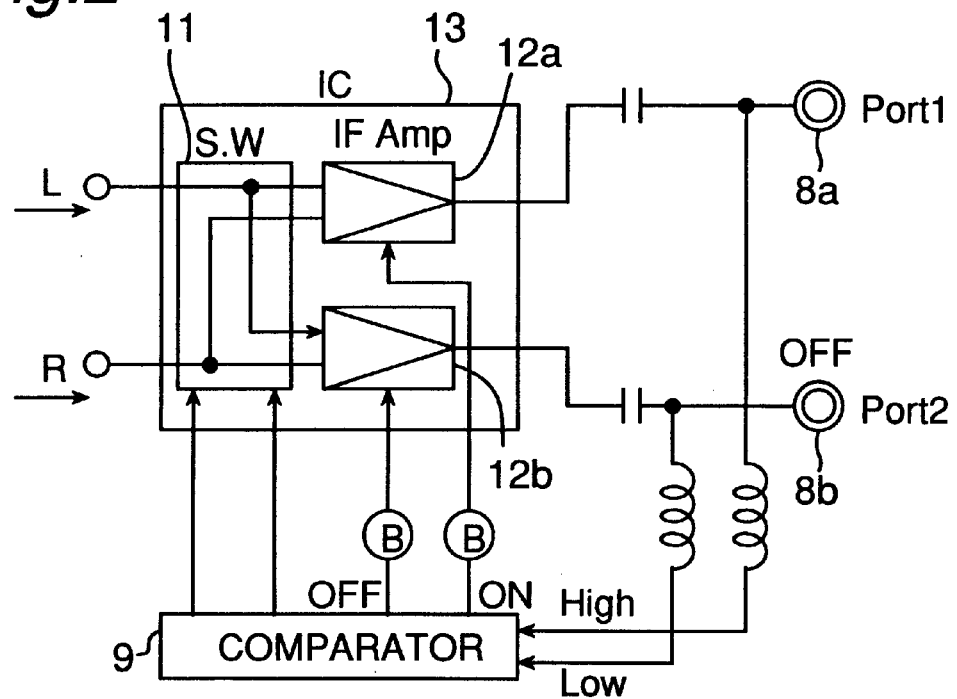
FIG. 2 is an operational explanatory view of main part of FIG. 1.

As shown in FIG. 2, when one output terminal 8b becomes no load, a voltage of 0 V lower than the voltage (10.5 to 14.5 V) for the selection of a Low is fed to the comparator 9. As a result, the comparator 9 feeds to the intermediate frequency amplifier 12b connected to the output terminal 8b a control signal for turning off the power of the intermediate frequency amplifier 12b.

Accordingly, the intermediate frequency amplifier 12b connected to the output terminal 8b with no load stops operation, so that any reflected waves due to a mismatching of impedance at the output terminal 8b with no load is eliminated. Thus, any deterioration of the isolation characteristic between the output terminals 8a, 8b is prevented.

Further in this embodiment, the switching circuit 11 and the intermediate frequency amplifiers 12a, 12b are implemented by one integrated circuit 13. Therefore, the wiring that might affect the isolation in the integrated circuit 13 can be made constant and brought to the best conditions. Moreover, the wiring pattern layout in the down converter circuit can be achieved easily.

Figure 3:
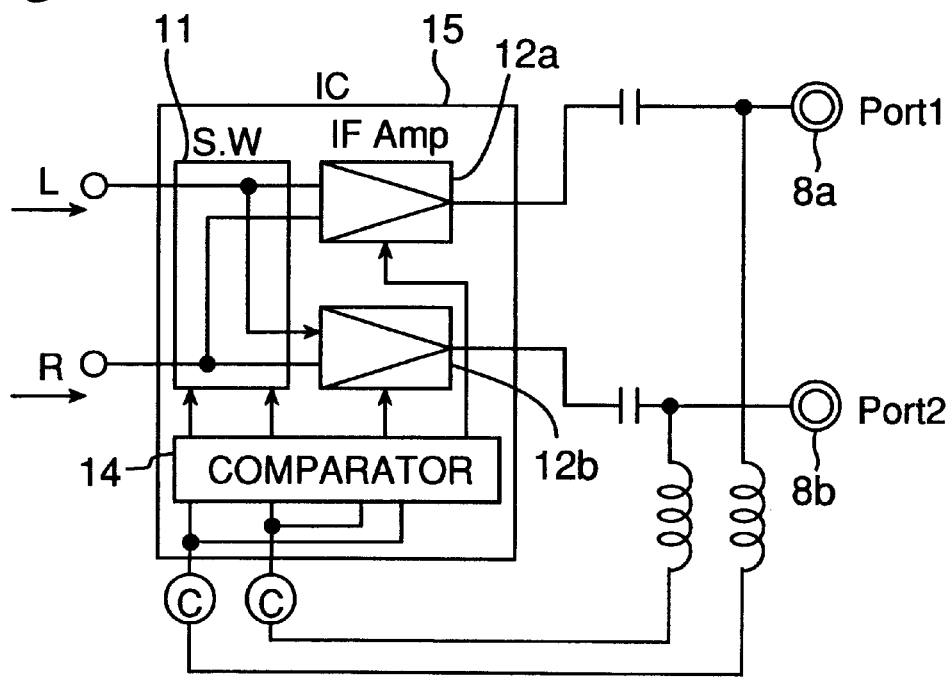
FIG. 3 is a block diagram of main part of another embodiment of the present invention.

FIG. 3 is a block diagram of main part of a second embodiment of the present invention, where component parts corresponding to those of FIG. 1 are designated by the same numerals. Referring to FIG. 3, reference numeral 14 denotes a comparator corresponding to the comparator shown in FIG. 1, and 15 denotes an integrated circuit in which a switching circuit 11, intermediate frequency amplifiers 12a, 12b and the comparator 14 are integrally formed. In the integrated circuit 15, are provided control terminals C for feeding a control voltage to the comparator 14 provided in the integrated circuit 15, and DC voltages to be applied to the output terminals 8a, 8b are fed to the control terminals C.

Accordingly, DC voltages responsive to the polarization signals to be selected are fed to the output terminals 8a, 8b, respectively, and the DC voltages fed to the output terminals 8a, 8b are fed to the control terminals C of the integrated circuit 15. The DC voltages of the output terminals 8a, 8b applied to the control terminals C are fed to the comparator 14, so that the comparator 14 controls the switching circuit 11 and the intermediate frequency amplifiers 12a, 12b in the same manner as in the case of FIG. 1, outputting the L signal or the R signal to the output terminals 8a, 8b, respectively.

Therefore, according to this embodiment, since the switching circuit 11, the intermediate frequency amplifiers 12a, 12b and the comparator 14 are formed in one integrated circuit 15, the number of parts can be reduced, while the wiring for the whole down converter circuit becomes easy to accomplish. Further, any deterioration of the isolation between wirings can be prevented.

The present invention having the above constitution, when an output terminal comes to a no-load, open state, the power of the intermediate frequency amplifier connected to this no-load output terminal is turned off, its operation being stopped. Thus, there will no longer occur any reflected waves due to impedance mismatching at the no-load output terminal, and any deterioration of the isolation between two output signals can be prevented.

Further, since a switching circuit for performing switching of two output signals and two intermediate frequency amplifiers or the switching circuit, the two intermediate frequency amplifiers and a control circuit therefor are formed in one integrated circuit, the individual circuits and the wirings for the circuits can be fixed in their best conditions so that the isolation between the circuits or between the wirings can be set to their best conditions. Also, since the switching circuit that is operated by DC voltages of the output terminals and the two control circuits for controlling the power of the two intermediate frequency amplifiers are implemented by a common control circuit, the circuit construction can be simplified, and therefore any deterioration of the isolation between the two output signals can be prevented.

What is claimed is:

1. A two-output low-noise down converter circuit in which a satellite broadcasting reception signal received by an antenna is divided into two signals of different polarization systems and which comprises:

a first frequency converter circuit made up of a first low-noise amplifier, a first band-pass filter and a first mixer that converts one divisional input signal into an intermediate frequency signal by a local oscillating frequency derived from a local oscillator;

a second frequency converter circuit made up of a second low-noise amplifier, a second band-pass filter and a second mixer that converts the other divisional input signal into an intermediate frequency signal by a local oscillating frequency derived from the local oscillator;

a switching circuit having a first terminal and a second terminal for selectively outputting two output signals of the first and second frequency converter circuits; and first and second intermediate frequency amplifiers for amplifying the two output signals of the switching circuit and selectively outputting two signals of different polarization systems at the first output terminal and the second output terminal, respectively;

a first control circuit for, when the first or second output terminal is of no load, shutting off power of the first or second intermediate frequency amplifier connected to the no-load output terminal.

2. The two-output low-noise down converter circuit according to claim 1, wherein the switching circuit as well as the first intermediate frequency amplifier and the second intermediate frequency amplifier connected to the first terminal and the second terminal of the switching circuit, respectively, are formed in an identical integrated circuit.

3. The two-output low-noise down converter circuit according to claim 1, further comprising a second control circuit for controlling switching of the switching circuit based on voltages applied to the first and second output terminals.

4. The two-output low-noise down converter circuit according to claim 3, wherein the switching circuit, the first and second intermediate frequency amplifiers, the first control circuit for controlling power of the first and second intermediate frequency amplifiers and the second control circuit for controlling the switching of the switching circuit are formed in an identical integrated circuit.

5. The two-output low-noise down converter circuit according to claim 4, wherein terminals for receiving voltages of the first and second output terminals are provided to the integrated circuit and the voltages of the first and second output terminals fed from the terminals to the integrated circuit are fed to the first and second control circuits, respectively.

* * * * *